United States Patent

[11] 3,600,684

[72] Inventor James R. Cherry
Barrington, Ill.
[21] Appl. No. 824,986
[22] Filed May 15, 1969
[45] Patented Aug. 17, 1971
[73] Assignee Motorola Inc.
Franklin Park, Ill.

[54] OVERLOAD COMPENSATION CIRCUIT FOR ANTENNA TUNING SYSTEM

7 Claims, 2 Drawing Figs.

[52] U.S. Cl. 325/319, 325/362, 325/374, 325/400, 330/29, 334/15
[51] Int. Cl. H04b 1/18, H03g 3/30, H03j 3/06
[50] Field of Search 325/318, 319, 362, 374, 379, 383, 385, 387, 404, 400, 422, 454, 464, 451; 334/11, 14, 15; 330/26, 29

[56] References Cited

UNITED STATES PATENTS

| | | | |
|---|---|---|---|
| 3,072,849 | 1/1963 | Firestone | 325/319 |
| 3,153,189 | 10/1964 | Sweeny | 323/66 |
| 3,205,444 | 9/1965 | Birkenes | 325/319 X |
| 3,277,388 | 10/1966 | Boyajian | 325/319 X |

*Primary Examiner*—Benedict V. Safourek
*Attorney*—Mueller and Aichele

ABSTRACT: As the RF signal supplied by an antenna to a varactor-tuned coupling circuit increases in magnitude, the impedance across an inductor in series with the varactor also increases due to the increased conductivity of an AGC-controlled field-effect transistor connected in the circuit of a secondary winding inductively coupled to the inductor. The system also is frequency sensitive, so that as the frequency of the RF signal applied across the inductor increases, the effective impedance also increases to compensate for increases of the reactance of the varactor diode at higher frequencies to maintain the RF signal level across the varactor diode at a level below that at which the diode rectifies the RF signals applied thereacross.

PATENTED AUG 17 1971 3,600,684

INVENTOR
JAMES R. CHERRY
BY Mueller, Aichele & Rauner
ATTYS.

OVERLOAD COMPENSATION CIRCUIT FOR ANTENNA TUNING SYSTEM

BACKGROUND OF THE INVENTION

The use of voltage-variable semiconductor diode capacitors for electronically tuning radio receivers has provided receiver designers with a wide latitude of design possibilities in the configurations which may be made in the receivers. This is especially desirable in the design of radio receivers for vehicular applications where it is desirable to provide means for remotely tuning the radio receiver from one or more locations within the vehicle. The use of tuning circuits including voltage-variable diode capacitors has some disadvantages, however, especially when high level RF signals from strong stations are applied to the tuning circuit.

Since the diode capacitor is a voltage controlled device, the characteristics of the diode capacitor respond to the level of the RF signals applied across it. When strong signals are applied across the diode capacitor, partial rectification of the signals by the diode capacitor occurs, causing a change in the DC bias on the diode. This then results in degradation of the circuit operation due to changes in the capacitance value of the reverse biased diode capacitor, and detuning of the circuit occurs.

In addition, as the frequency to which the circuit is tuned is increased, the reactance of the diode capacitor also increases, causing an increased amount of the input signal to appear across the voltage-variable tuning capacitor if the other impedances in series with the diode capacitor remain constant.

The above problems are especially severe in the antenna stage, so that it is desirable to provide a means of preventing high signal levels from being applied across the voltage-variable tuning capacitor used in the antenna tuning stage of the receiver. It also is desirable to provide a frequency-sensitive control of this type in order to compensate for the frequency-sensitive changes in the reactance of the voltage-variable tuning capacitor.

SUMMARY OF THE INVENTION

It is an object of this invention to provide an overload compensation circuit for the voltage-variable reactance device used in an antenna tuning circuit.

It is an additional object of this invention to provide a frequency-sensitive variable impedance to limit the signal voltage applied across the voltage-variable reactance device used in an antenna tuning circuit.

It is a further object of this invention to limit the signal voltage appearing across a voltage-variable capacitor in an antenna tuning circuit by inductively coupling a variable impedance in series with the voltage-variable capacitor.

An antenna tuning circuit including a voltage-variable reactance is connected in series between an antenna and the input of an RF amplifier stage. Overload compensation for the voltage-variable reactance is achieved by supplying a signal level responsive control voltage to a frequency-sensitive variable impedance connected in series with the voltage-variable reactance, the impedance varying in accordance with the control voltage and with the frequency of the input signals appearing across the voltage-variable reactance device in the tuning circuit.

DETAILED DESCRIPTION

Figure 1:
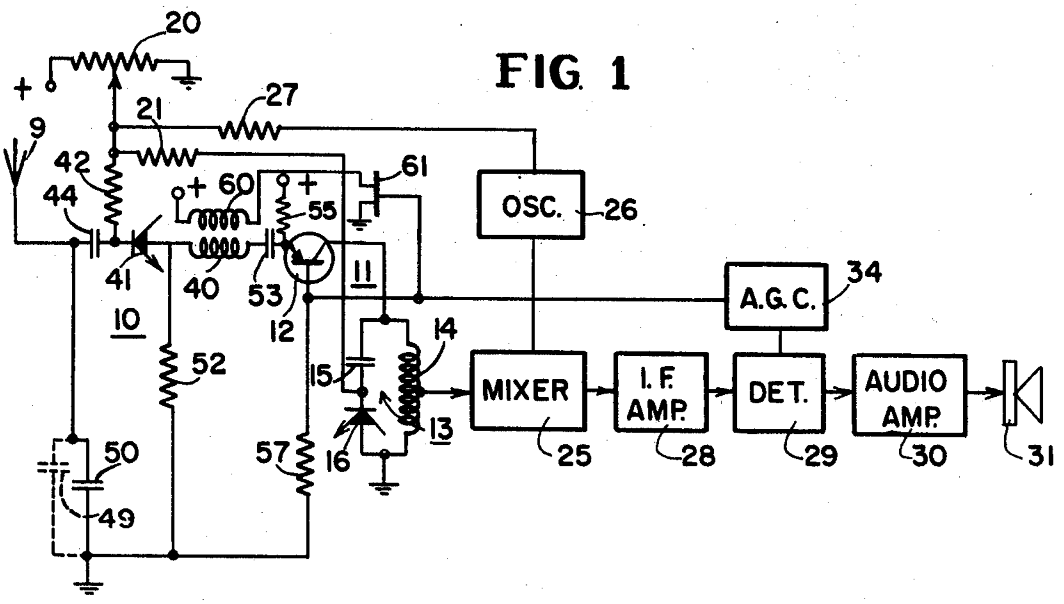
FIG. 1 is a schematic wiring diagram partially in block form illustrating a preferred embodiment of the invention.

Referring now to the drawing, there is shown an AM radio receiver circuit for receiving signals over an antenna 9, shown as a voltage generator and associated capacitance for a better understanding of the circuit, with the antenna being coupled through a series-tuned L-C circuit 10 to the input of an RF amplifier stage 11 including a common-base PNP transistor 12. The signals from the coupling circuit 10 are applied across the emitter-base path of the transistor 12 which has a tuned circuit 13 connected to its collector. The tuned circuit 13 consists of a tapped coil 14 with a blocking capacitor 15 and a voltage-variable tuning capacitor 16 connected in series across the coil 14. The voltage-variable capacitor 16 and the coil 14 form the resonant circuit for the RF amplifier transistor 12, and this circuit is tuned over a predetermined frequency range.

The voltage-variable capacitor 16 is a two-terminal PN junction semiconductor device which exhibits a change in capacitance proportional to a change in the direct current reverse bias across the device. Voltage-variable capacitors or reactive devices of this type are well known, and an increase in the reverse bias voltage across such a capacitor causes its capacitance to decrease, thereby increasing the capacitive reactance. A decreased reverse bias results in the opposite effect, that is, the capacitance of the device increases and the capacitive reactance decreases. Devices which preferably may be used for the voltage-variable capacitor 16 are hyperabrupt varactor diodes since the hyperabrupt diodes exhibit great capacitance changes in response to the biasing voltage and thus are operable over a wide frequency range.

The biasing potential or tuning voltage for the voltage-variable capacitor 16 is obtained from the tap of a potentiometer 20 and is applied through an isolating resistor 21 to the junction between the voltage-variable capacitor 16 and the blocking capacitor 15. The potentiometer 20 may be located in the radio receiver itself or at a remote location and provides direct current potentials of varying amounts.

The selected radio frequency signal obtained from the tap on the coil 14 of the tank circuit 13 is applied to one input of a mixer 25, the other input of which receives signals from a local oscillator 26, which also may include a tuning circuit or tank circuit having a voltage-variable capacitor similar to the capacitor 16. The frequency of the oscillator tank circuit also may be controlled by the biasing potential obtained from the potentiometer 20 and applied through a coupling resistor 27 to the oscillator 26. The amplified RF signals are heterodyned with the local oscillator signals from the oscillator 26 by the mixer 25 to produce intermediate frequency signals. These IF signals then are amplified in an IF amplifier 28 and are detected in a detector stage 29, which supplies the signals to an audio amplifier 30, which in turn drives a speaker 31. An automatic gain control signal is obtained from the detector 29 in a conventional manner and is applied to an AGC circuit 34, the output of which is applied to the base of the transistor 12 in the RF amplifier 11 in order to provide automatic gain control of the transistor 12.

In addition to the voltage-variable capacitor tuning devices in the RF tank circuit 13 and in the oscillator 26, the coupling circuit between the high-impedance capacitive antenna 9 and the relatively low-impedance emitter-base path of the transistor 12 includes a series tuned L-C circuit including an inductor 40 and another voltage-variable capacitor 41 as its principal elements. The output of the potentiometer 20 is applied through a third isolating resistor 42 to the junction of the voltage-variable capacitor 41 and a blocking capacitor 44. The capacitance of the capacitor 44 is chosen to be much greater than the capacitance of the other capacitors in the circuit; so that it has little affect on the AC signals present in the circuit, while serving to block any DC signals obtained from the potentiometer 20.

When the radio receiver is used in an automobile, the antenna 9 is a capacitive whip antenna, so that additional capacitance to ground exists, due primarily to the cable which connects the whip antenna to the radio receiver; and this capacitance is in the form of a shunt capacitance represented by a capacitor 49 (shown in dotted lines) connected between ground and the junction of the antenna 9 and the capacitor 44.

In order to adjust the radio receiver system to cover the AM band of frequencies normally received by such a receiver, an additional shunt capacitance 50 also may be provided across the antenna output, and is shown as also being connected between ground and the junction of the antenna 9 and the capacitor 44. The value of the capacitance 50, when added to the capacitance of the capacitor 49, forming a parallel combination in series with the capacitor 41, should provide the desired capacitance ratio needed to tune the AM band.

In order to provide a DC return path for the tuning voltage used to tune the voltage-variable capacitor 41, a high-impedance resistor 52 is connected between ground and the junction of the capacitor 41 and the inductor 40. The resistance of the resistor 52 is chosen to be very high, so that it appears essentially as an open circuit to any AC signals present in the circuit. To prevent the variable tuning voltage applied to the voltage-variable capacitor 41 from adversely affecting the operating level of the transistor 12, a second DC blocking capacitor 53 is provided between the inductor 40 and the emitter of the transistor 12. Like the capacitor 44, the blocking capacitor 53 also is chosen to have a capacitance substantially in excess of the other capacitors in the circuit so as to have substantially no affect on the AC signals present.

The DC operating level for the transistor 12 is obtained in a conventional manner by means of a resistor 55 connected between a source of positive potential and the emitter, and a resistor 57 is connected between the base of the transistor 12 and ground potential.

When strong or high level AC signals are applied across a voltage-variable capacitor diode such as the diode 41, there is a tendency for the diode to rectify or partially rectify the AC signals appearing thereacross. Such rectification of these AC signals then causes degradation in the operation of the circuit using the voltage-variable capacitor diode due to the detuning of the voltage-variable capacitor diode by the rectified DC which is present in addition to the normal DC biasing potential. This problem also is more acute at higher frequencies due to the fact that the reactance of the voltage-variable capacitor diode increases with increasing frequencies to which the circuit may be tuned. As a result, input signal levels which are insufficient to cause rectification at low frequencies might cause partial rectification at higher frequencies, even though there is no change in the input signal level itself.

In order to provide compensation for AC overloads resulting from strong RF signal levels being obtained from the antenna 9, and further to compensate for the frequency-responsive changes in reactance of the voltage-variable capacitor diode, a secondary winding 60 is inductively coupled to the inductor 40, with the winding 60 being connected in series with an N-type field-effect transistor between a source of positive potential and ground. The AGC voltage obtained from the AGC circuit 34 is applied to the junction of the base of the transistor 12 with the resistor 57 and also is applied to the gate of the field-effect transistor 61. In the RF amplifier stage 11 the AGC voltage provides gain control for the RF amplifier transistor 12 and also acts, in effect, to change the input impedance of the transistor 12 to the RF signals by changing the emitter-base impedance connected in series with the antenna tuning circuit 10.

When the AGC voltage increases in response to increased signal levels, the bias on the base of the transistor 12 is such as to cause the transistor 12 to conduct less. This appears as an increase in the effective input impedance of the emitter-base path of the transistor 12 insofar as the output of the antenna coupling circuit 10 is concerned. As a result, an increased RF voltage drop is present across the emitter-base path of the transistor 12, and the RF voltage across the voltage-variable capacitor 41 does not increase in proportion to the increase in the antenna input voltage. Thus, for a given frequency, the RF voltage which appears across the voltage-variable capacitor 41 is limited by this AGC action to a value below that where the diode 41 would rectify or partially rectify the AC signals.

In order to provide sufficient compensation over the entire frequency range of circuit operation by using only the change in impedance of the emitter-base path of the transistor 12 as a variable resistance to limit the RF voltage across the voltage-variable capacitor 41, it would be necessary to provide an impedance which is high enough to provide the desired protection at the maximum frequency to which the circuit 10 may be tuned, even though such an impedance may be in excess of that required to provide the desired overload protection at lower frequencies. Thus, when the circuit is operated at lower frequencies, the impedance in series with the voltage-variable capacitor diode 41 could be unnecessarily excessive.

By inductively coupling a variable impedance to the inductor 40, however, the desired frequency-sensitive variable impedance in series with the voltage-variable diode capacitor 41 can be achieved. By experimentation, it has been ascertained that for an input RF voltage of 1 volt, the voltage across the voltage-variable capacitor 41 should be limited to approximately 0.1 volts. These conditions were found to be satisfied by a formula for the resistance R in series with the voltage-variable capacitor 41 as follows: $R=3f/1{,}000-800$, where $f$ is the frequency. The frequency term $f$ in this formula is necessitated by the fact that the reactance of the voltage-variable capacitor 41 increases with increasing frequencies. Therefore, it is necessary to increase the series resistance with increasing frequencies in order to maintain the desired 0.1-volt drop across the voltage-variable capacitor 41 at higher frequencies. A plot of this solution for R, which is considered to be the ideal solution, is given in curve A of FIG. 2.

Since the frequency component cannot be realized merely by providing an AGC controlled variable resistance in series with the varactor diode, the inductively coupled winding 60 and the field-effect transistor 61 are provided to approximate this desired ideal curve A for the series resistance. At low frequencies of operation, the added resistance provided by the circuit including the winding 60 and the field-effect transistor 61 should be low, and in addition for low signal levels the resistance added by this circuit should be low or zero. This latter condition is satisfied for low signal level since, for such signal levels, the AGC voltage applied to the gate of the transistor 61 is sufficiently low to cause the transistor 61 to act as an open switch; so that the circuit including the winding 60 and the transistor 61 does not affect the operation of the remainder of the circuit shown in FIG. 1.

As the AGC voltage increases to a more positive value, however, the transistor 61 presents initially a relatively high finite impedance in series with the winding 60, with this impedance becoming increasingly less as the AGC voltage increases. As the transistor 61 becomes more conductive, the AC impedance across the winding 40 tends to increase, due to the inductive coupling between the winding 40 and the winding 60 in series with the drain source path of the transistor 61. The equivalent series circuit resistance given by the circuit shown in FIG. 1 may be expressed by the formula: $R=af^2+b$, where $b$ is the resistance of the emitter-base path of the transistor 12 and the resistance of the resistor 57, and $$a=\frac{4\pi^2L^2}{R||},$$

with $L$ being the inductance of the inductor 40 and $R||$ being the parallel resistance coupled into the circuit by the winding 60.

Figure 2:
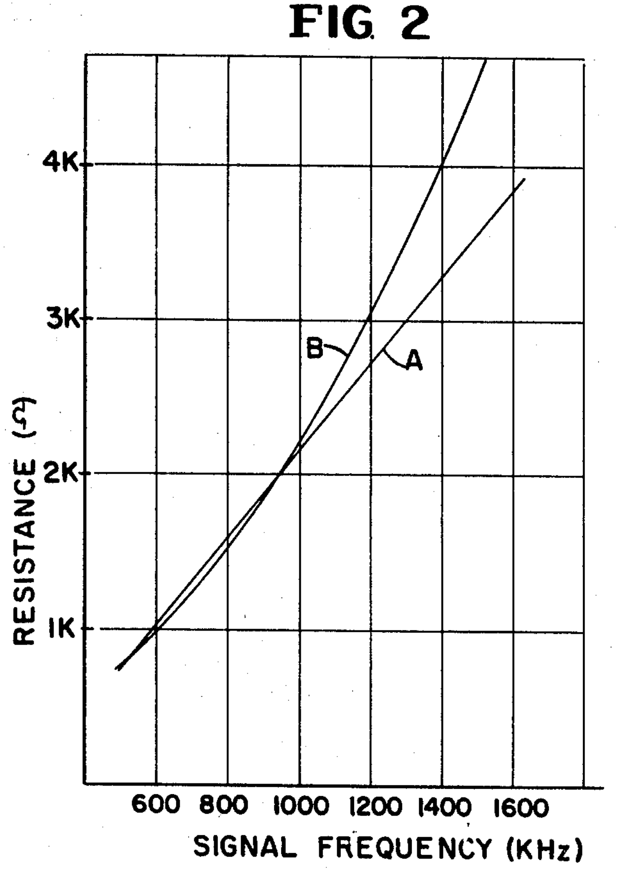
FIG. 2 shows curves useful in explaining the operation of the circuit of FIG 1.

In order most closely to approximate the conditions shown in curve A in FIG. 2, for a circuit where the combined capacitance of the capacitors 44 and 48 is approximately 30pf. and the resultant capacitance in the branch including the capacitors 49 and 50 is 370pf. and where the inductor 40 is 0.55mh. it was found that making $b$ equal to 250 ohms and R equal 6,000 ohms at approximately the middle operating frequencies fulfilled the requirements. In order to obtain the desired value of the impedance for $R||$ the turns ratio of the windings 60 and 40 may be adjusted. With the aforementioned values, the changes in the circuit resistance with frequency alone are shown in curve B of FIG. 2. Thus, the desired variation in the series resistance increasing with increasing frequency is achieved. In addition, by decreasing the impedance of the transistor 61 for increasing AGC voltage levels, further increases in the series resistance are effected in accordance with increasing signal levels of the input RF signal at all frequencies of operation.

From the foregoing, it may be seen that the overload compensation circuit shown in FIG. 1 provides compensation both for increasing signal levels of the input RF signal and for increasing frequencies to increase the impedances in series with the voltage-variable capacitor diode 41 when either or both of these conditions occur.

I claim:

1. In a wave signal receiving apparatus having an antenna, an RF amplifier stage, and an antenna tuning circuit means electrically coupling the antenna and the RF amplifier stage, the tuning circuit means including voltage-variable reactance means and circuit means connected to the voltage-variable reactance means for applying a variable bias potential thereto to selectively tune the antenna tuning circuit means to a predetermined frequency, an overload compensation circuit for said voltage-variable reactance means including in combination:

- frequency and voltage-variable impedance means exhibiting increased impedance with increasing frequencies of signals applied thereacross;
- connecting means for connecting said voltage-variable reactance means of said antenna tuning circuit and said variable impedance means in series between said antenna and said RF amplifier stage;
- control circuit means responsive to the output of said RF amplifier stage for deriving a control voltage corresponding to the magnitude of the wave signal; and
- means for applying the control voltage to said variable impedance means further to vary the impedance thereof in response to variations in the magnitude of the signals obtained from the output of said RF amplifier stage.

2. The combination according to claim 1 further including means for applying the control voltage to said RF amplifier stage to vary the input impedance of said RF amplifier stage in response to variations in the magnitude of the signals obtained from the output of said RF amplifier stage.

3. The combination according to claim 1 wherein said tuning circuit means includes an inductance means connected in series with said voltage-variable reactance means and wherein said frequency-sensitive variable impedance means is formed by inductively coupling a variable impedance to said inductance means.

4. The combination according to claim 3 wherein said voltage-variable reactance means is a voltage-variable capacitor.

5. The combination according to claim 3 further including a winding inductively coupled to said inductance means, wherein said variable impedance includes a transistor having at least a control electrode and another electrode, with said other electrode connected in series with said winding and with the control voltage being applied to the control electrode thereof.

6. The combination according to claim 5 wherein said transistor is a field-effect transistor having a gate and a drain-source path, the drain-source path being connected in series with said winding, and the gate being connected with said means for applying the control voltage.

7. The combination according to claim 6 wherein said control circuit means is an automatic gain control circuit providing an automatic gain control voltage which said applying means applies to the gate of said transistor to increase the conductivity thereof for increased levels of outputs from said RF amplifier stage to reduce the impedance in series with said winding, thereby effectively increasing the impedance of said inductance means in series with said voltage-variable reactance to limit the voltage drop thereacross by causing an increased voltage drop to occur across said inductance means.